United States Patent
Li et al.

(10) Patent No.: US 6,342,426 B1
(45) Date of Patent: Jan. 29, 2002

(54) METHOD FOR PROTECTING STEPPER ALIGNMENT MARKS

(75) Inventors: Kam-Tung Li, Hsinchu Hsien; Chung-Chih Yeh, Chiayi Hsien, both of (TW)

(73) Assignee: Mosel Vitelic Inc., Hsinchu (TW)

( * ) Notice: Subject to any disclaimer, the term of this patent is extended or adjusted under 35 U.S.C. 154(b) by 0 days.

(21) Appl. No.: 09/854,952

(22) Filed: May 10, 2001

(30) Foreign Application Priority Data

Feb. 8, 2001 (TW) ........................ 90102800 A

(51) Int. Cl.$^7$ .............................................. H01L 21/76
(52) U.S. Cl. .................... 438/401; 438/462; 430/22; 430/318
(58) Field of Search ................ 438/401, 462; 430/22, 318

(56) References Cited

U.S. PATENT DOCUMENTS 6,057,206 A * 5/2000 Nguyen et al. ............. 438/401
6,197,481 B1 * 3/2001 Chang et al. ............... 430/314
6,207,966 B1 * 3/2001 Nguyen et al. ............. 250/548

* cited by examiner

Primary Examiner—John F. Niebling
Assistant Examiner—David A. Zarneke
(74) Attorney, Agent, or Firm—Darby & Darby

(57) ABSTRACT

A method for protecting stepper alignment marks suitable for a substrate with an alignment mark on a scribe line and a metal layer that will be etched includes the following steps. First, a photoresist layer is formed over the metal layer. Next, a photo mask which has a predefined photo mask pattern for transfer to the metal layer is provided, and a pattern protecting the alignment marks is added to the photo mask pattern. Then, a photolithographic process is performed with the photo mask pattern on the photoresist layer to form the desired transferring photoresist mask to the metal layer and the protective photoresist mask for protecting the alignment marks.

5 Claims, 4 Drawing Sheets

METHOD FOR PROTECTING STEPPER ALIGNMENT MARKS

BACKGROUND OF THE INVENTION

1. Field of the Invention

The present invention relates to a semi-conductor manufacturing process. More particularly, it relates to a method for protecting stepper alignment marks.

2. Description of the Prior Art

Alignment marks are indispensable for the photolithographic processing of semiconductor wafers. Alignment marks help ensure that the masks which are necessary for exposing the photoresist on the semiconductor wafer can be aligned exactly. This presupposes that the alignment marks have an exact assignment to the structures to be fabricated on the semiconductor wafer and, furthermore, offer a sufficient topographical contrast to be able to be reliably identified.

For power IC products, damage to the scribe line due to metal etching process-related problems usually cannot be avoided. However, along the scribe, there are many stepper alignment marks, which are used for stepper alignment while exposing the wafer. Due to this damage, these marks cannot be used for alignment causing difficulties with the photo process.

In order to ensure thorough etching in the metal etching process, when a portion requiring lower etching rates is finished, an underlying film beneath an earlier completed etching portion will also be etched, resulting in over-etching. Since the thickness of the metal layer in power IC products is thicker (3 µm) than general products, under normal process circumstances, the scribe line will be damaged after the metal etching process. The marks cannot be used for alignment on subsequent photolithographic processes.

FIG. 1 is a diagrammatic top view of a substrate after etching a metal layer thereon. The substrate 10 is divided into the integrated circuit area 12 and the scribe line 14, and the alignment mark 16 is situated on the scribe line 14. As can be seen, the scribe line is damaged after the metal etching process, thus rendering the alignment marks indistinct. The consequence is an increased outlay on post processing on account of the mask's misalignment. Alignment may even become impossible. This problem is becoming more prevalent as the result of ever-decreasing structure widths and increased demands for alignment accuracy.

SUMMARY OF THE INVENTION

Accordingly, an object of the present invention is to provide a method for protecting stepper alignment marks. Since process-related damage only occurs after metal etching, in order to protect all the alignment marks during the metal etching process, a protection pattern (mark) is added right above the mark needed to be protected on the metal photo layer mask. By doing this, the photoresist remains after the metal photo layer and the photoresist is used to protect all the alignment marks from the metal etching. After metal dry etching, the photoresist remaining on top of the alignment marks is removed and the undamaged marks underneath can be used for stepper alignment.

According to the present invention, a method for protecting stepper alignment marks suitable for a substrate with an alignment mark on a scribe line and a metal layer that will be etched includes the following steps. First, a photoresist layer is formed over the metal layer. Next, a photo mask which has a predefined photo mask pattern for transfer to the metal layer is provided, and a pattern protecting the alignment mark is added to the photo mask pattern. Then, a photolithographic process is performed with the photo mask pattern on the photoresist layer to form the desired transferring photoresist mask to the metal layer and the protective photoresist mask for protecting the alignment marks.

BRIEF DESCRIPTION OF THE DRAWINGS

The following detailed description, given by way of examples and not intended to limit the invention to the embodiments described herein, will best be understood in conjunction with the accompanying drawings, in which.

DETAILED DESCRIPTION OF THE INVENTION

The present invention provides a method for protecting stepper alignment marks.

Figure 1:
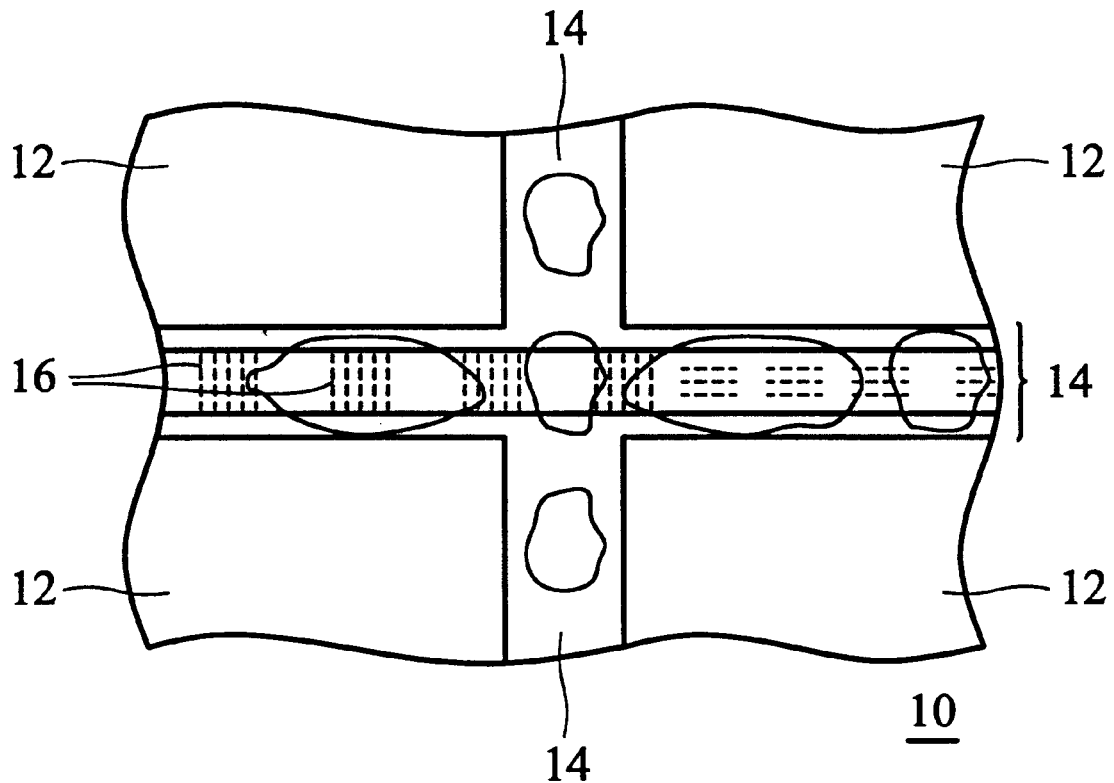
FIG. 1 is a diagrammatic top view of a substrate after etching a metal layer thereon.
Figure 2A:
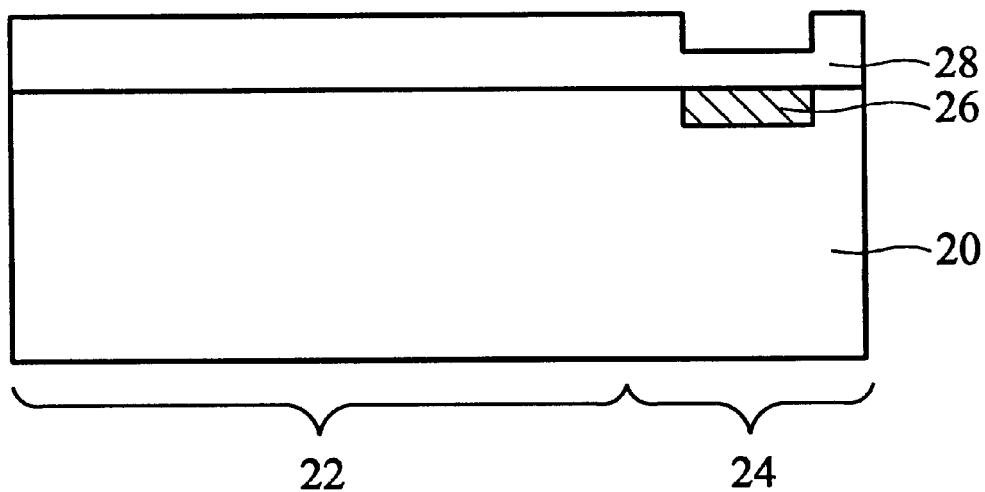
FIGS. 2A through 2E illustrate, in cross-section, the process of a preferred embodiment according to the present invention.

This embodiment begins by providing a substrate 20, as shown in FIG. 2A. The substrate 20 includes an integrated circuit area 22 and a scribe line 24. The substrate 20 also has an alignment mark 26 on the scribe line 24 and a metal layer 28 that will be etched. The substrate 20 is selected from the group consisting of glass, ceramic, metal, semiconductor, polymer and combinations thereof. Materials used for alignment marks depend on the individual process. If the marks are formed after an oxide process, the marks will be oxide. If the marks are formed after a polysilicon process, the marks will be polysilicon. All the marks are formed after the etching process. The metal layer 28 can be comprised of, for example, metal, an alloy, preferably comprised of copper, aluminum, or its alloy.

Figure 2B:
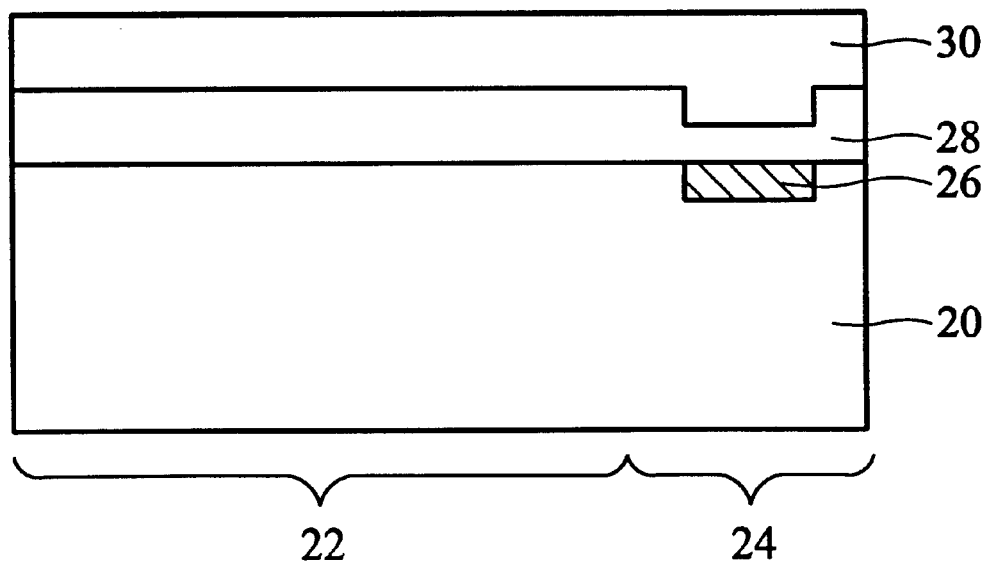

Next, as shown in FIG. 2B, a photoresist layer 30 is formed over the metal layer 28. The photoresist layer 30 is preferably formed by a spin coating process.

Figure 2C:
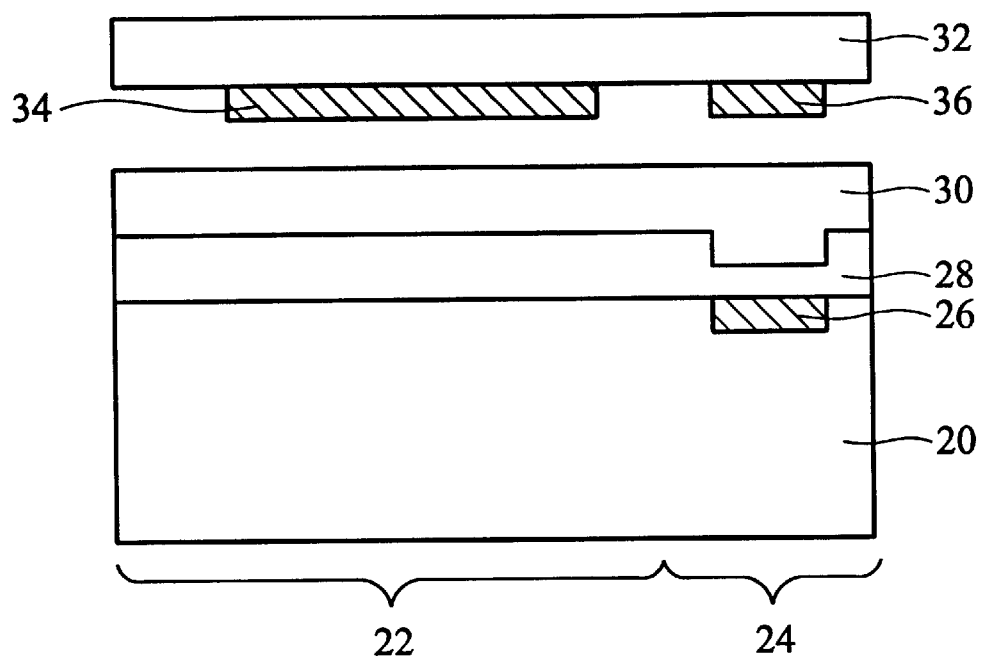

With reference to FIG. 2C, a photo mask 32 with a predefined photo mask pattern 34 for transfer to the metal layer 28 is provided. A pattern 36 protecting the alignment marks is added to the photo mask pattern 34.

Figure 2D:
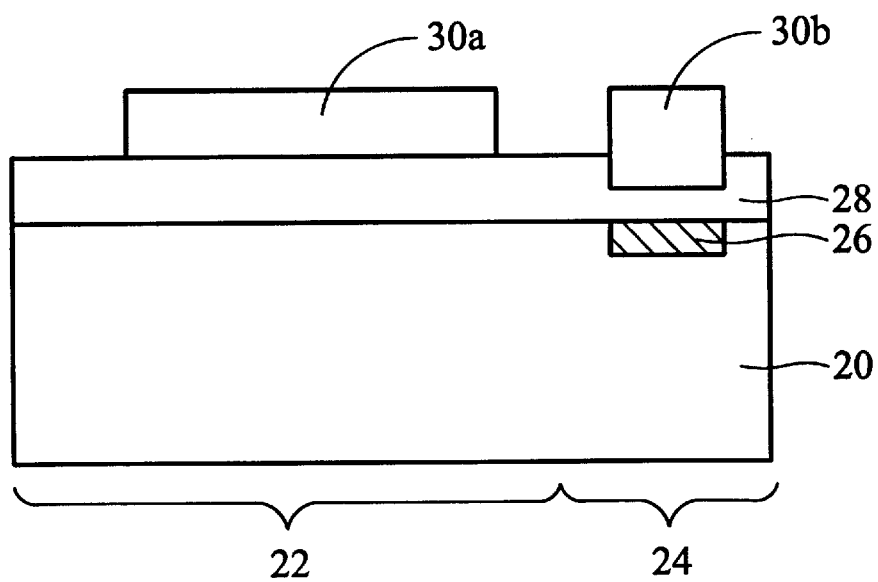

Referring to FIG. 2D, a photolithographic process is performed with the photo mask pattern 34 on the photoresist layer 30 to form the desired transferring photoresist mask 30a to the metal layer and the protective photoresist mask 30b for protecting the alignment mark. Photolithographic process includes generally exposing and developing technologies, and exposing technologies include stepperexposing technology.

Figure 2E:
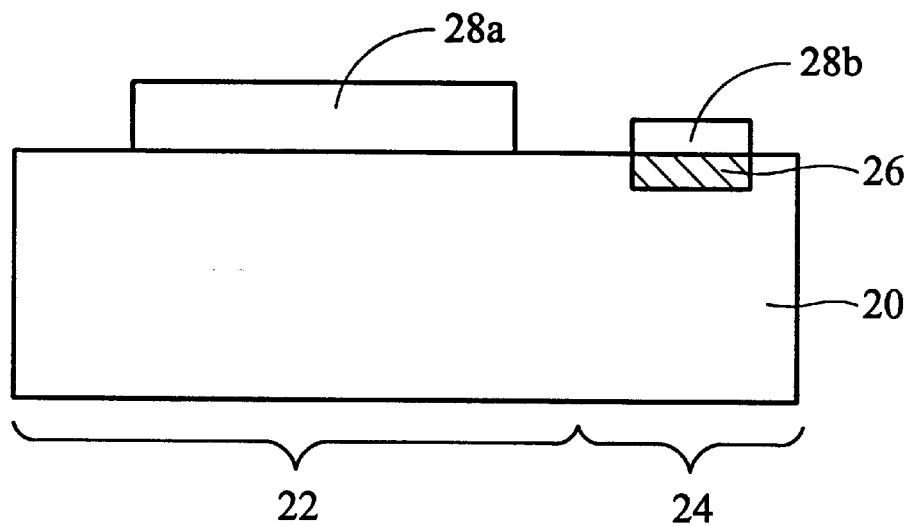

Finally, the photoresist mask 30a and 30b are used as a mask for etching the metal layer 28 to form the desired etching pattern, then the photoresist mask 30a and 30b are removed. As a result, as shown in FIG. 2E, wherein metal layer 28a is the desired transferring pattern, and metal layer 28b is the protective pattern for protecting the alignment mark. The etching process is preferably an anisotropical dry etching or an isotropical wet etching process.

Figure 3:
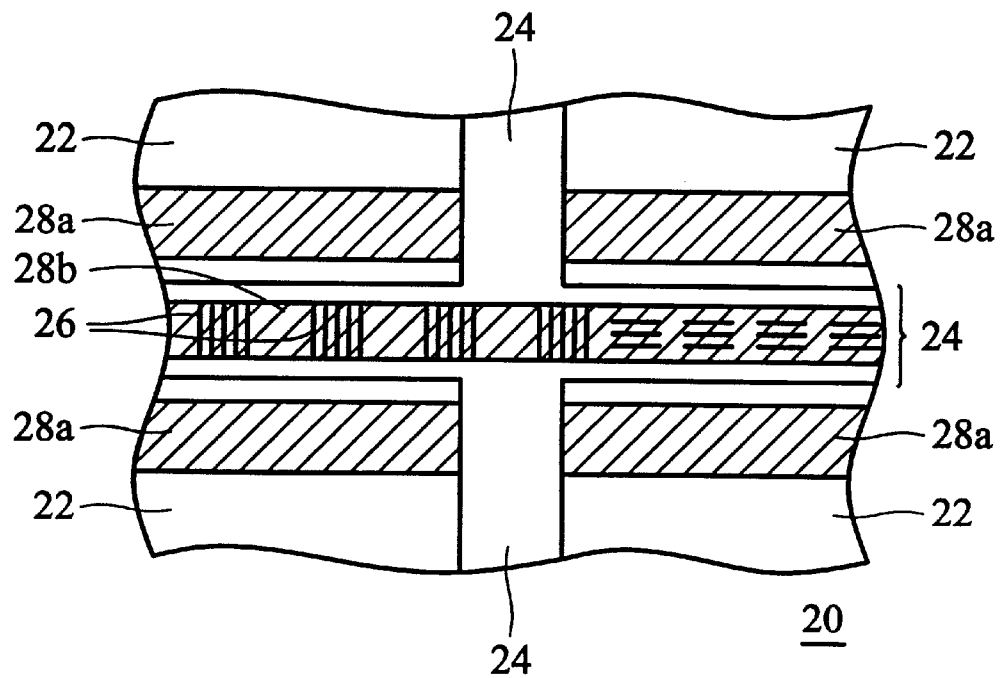
FIG. 3 is a diagrammatic top view after performing the processes for protecting stepper alignment marks, in accordance with a preferred embodiment of the present invention.

FIG. 3 is a diagrammatic top view after performing the processes for protecting stepper alignment marks, in accordance with a preferred embodiment of the present invention.

The substrate 20 is divided into the integrated circuit area 22 and the scribe line 24, and the alignment mark 26 is situated on the scribe line 24. As can be seen, due to the alignment mark 26 is protected with metal layer 28b as the protective pattern, the alignment mark 26 is still clear.

While the invention has been particularly shown and described with the reference to the preferred embodiments thereof, it will be understood by those skilled in the art that various changes in form and details may be made without departing from the spirit and scope of the invention.

What is claimed is:

1. A method for protecting stepper alignment marks suitable for a substrate with an alignment mark on a scribe line and a metal layer that will be etched, comprising the steps of:

forming a photoresist layer over the metal layer;

providing a predefined photo mask pattern for transferring to the metal layer, the photo mask pattern having a pattern protecting the alignment mark; and performing a photolithographic process with the photo mask pattern to the photoresist layer.

2. The method of claim 1 wherein the substrate is selected from the group consisting of glass, ceramic, metal, semiconductor, polymer and combinations thereof.

3. The method of claim 1 further comprising a step of using the photoresist layer as a mask and etching the metal layer.

4. A method for protecting stepper alignment marks suitable for a substrate with an alignment mark on a scribe line and a metal layer that will be etched, comprising the steps of:

forming a photoresist layer over the metal layer;

providing a predefined photo mask pattern for transfer to the metal layer, the photo mask pattern having a pattern protecting the alignment mark;

performing a photolithographic process with the photo mask pattern to the photoresist layer; and using the photoresist layer as a mask and etching the metal layer.

5. The method of claim 1 wherein the substrate is selected from the group consisting of glass, ceramic, metal, semiconductor, polymer and combinations thereof.

* * * * *